United States Patent [19]

Kawaguchi et al.

[11] Patent Number: 4,980,266

[45] Date of Patent: Dec. 25, 1990

[54] PHOTOSENSITIVE RESIN COMPOSITION

[75] Inventors: Taku Kawaguchi; Yoshitaka Minami; Tatsuya Ichikawa, all of Hitachi, Japan

[73] Assignee: Hitachi Chemical Company, Ltd., Tokyo, Japan

[21] Appl. No.: 523,373

[22] Filed: May 15, 1990

[30] Foreign Application Priority Data

May 18, 1989 [JP] Japan ................................. 1-124978

[51] Int. Cl.$^5$ ............................................... B03C 1/73
[52] U.S. Cl. ................................... 430/281; 430/271; 430/910; 430/919; 430/920; 522/25; 522/63
[58] Field of Search .................. 430/271 A, 281, 910, 430/919, 920; 522/25, 63

[56] References Cited

U.S. PATENT DOCUMENTS

| | | | |
|---|---|---|---|
| 4,284,707 | 8/1981 | Nagasawa et al. | 522/63 |
| 4,289,843 | 9/1981 | Boutle et al. | 430/919 |
| 4,320,189 | 3/1982 | Taguchi et al. | 430/920 |
| 4,543,318 | 9/1985 | Maeda et al. | 430/919 |

*Primary Examiner*—Jack P. Brammer
*Attorney, Agent, or Firm*—Antonelli, Terry, Stout & Kraus

[57] ABSTRACT

A photosensitive resin composition comprising (A) a carboxyl group-containing film-forming property imparting polymer, (B) a copolymerizable vinyl compound, (C) a photopolymerization initiator, and (D) a 1,2,3-benzotriazole derivative is useful for forming a photosensitive film excellent in resistance to plating and stability.

6 Claims, No Drawings

PHOTOSENSITIVE RESIN COMPOSITION

BACKGROUND OF THE INVENTION

This invention relates to a photosensitive resin composition and a photosensitive resin composition laminate (hereinafter abbreviated as "photosensitive film") and more particularly it relates to a photosensitive resin composition and a photosensitive film which are excellent in resistance to plating and stability.

Photosensitive resin compositions and photosensitive films have been widely used as resist materials for etching, plating, etc., for example, in production of printed circuit boards and precision machining of metals. As a process for producing a printed circuit board, plating method is becoming a leading process because in recent years, the pattern density of printed circuit board has been increased and the width of pattern has been reduced.

The plating method comprises coating a resist on a substrate except for portions in which through-holes for mounting chips and an electric circuit are to be formed, forming the through-holes and the electric circuit, peeling off the resist, followed by etching, and thereby obtaining the electric circuit. As a plating solution in the plating method, there are used solutions of copper pyrophosphate, copper sulfate, solder, nickel, palladium, gold, etc. In general, copper sulfate is used for producing an electric circuit and solder is used for protecting the electric circuit.

In the plating method, an additive is incorporated into a photosensitive resin composition in order to enhance the adhesion between a base metal (copper is mainly used) and a photosensitive film. As the additive, there have been disclosed a heterocyclic compound in Japanese Patent Appln. Kokai (Laid-Open) No. 53-702, phthalazone or a derivative thereof in Japanese Patent Appln. Kokai (Laid-Open) No. 55-65202, indazole or a derivative thereof in Japanese Patent Appln. Kokai (Laid-Open) No. 55-65203, tetrazole or a derivative thereof in Japanese Patent Appln. Kokai (Laid-Open) No. 59-125726, lophine in Japanese Patent Appln. Kokai (Laid-Open) No. 59-125727, and carboxybenzotriazole in Japanese Patent Appln. Kokai (Laid-Open) No. 63-24243.

However, employment of these compounds improves the adhesion but causes the following troubles. After development, organic substances tend to remain on a base metal (resulting in reddening of the base metal surface when the remaining is not considerable, or resulting in a phenomenon called "scum"), and no plating layer is deposited, or the adhesion between deposited metal and the base metal is lowered, so that a plating layer is peeled off.

Japanese Patent Appln. Kokai (Laid-Open) No. 61-223836 has disclosed a 1,2,3-benzotriazole derivative. Employment of this compound is disadvantageous in that when there is conducted gold plating, copper plating using copper pyrophosphate, or the like, which requires severe treatment conditions, there is caused peeling-off of a resist film, its lifting, or underplating of a plating layer (a phenomenon that a plating layer is deposited under a resist and on a substrate metal surface).

In the production of a printed circuit board, there are many steps from lamination of a photosensitive film on a base metal to formation of a resist pattern, and therefore a long time is often required (in particular, the lamination product is often allowed to stand for 1 to 14 days from the lamination to imagewise exposure), so that the above-mentioned reddening and scum are promoted. Conventional photosensitive resin compositions have a low heat stability and hence undergo thermopolymerization, resulting in reddening or scum. For suppressing the thermopolymerization, additives are often used in photosensitive resin compositions. As the additives usable for this purpose, there are well known and often used quinones such as hydroquinone, benzoquinone, hydroquinone monomethyl ether, etc., and phenolic compounds. But, employment of such an additive causes problems such as lowering of the sensitivity and increase of the exposure time. From such a viewpoint, when the additive is used, its amount is preferably 1 part by weight or less, more preferably 0.5 part by weight or less, most preferably 0.1 part by weight or less, per 100 parts by weight of a polymerizable vinyl compound.

SUMMARY OF THE INVENTION

It is an object of this invention to solve such problems of prior art and provide a photosensitive resin composition and a photosensitive film obtained by laminating a layer of said photosensitive resin composition, which are excellent in resistance to plating and stability without lowering of the adhesion between base metal and deposited metal.

This invention provides a photosensitive resin composition comprising (A) a carboxyl group-containing, film forming properties-imparting polymer, (B) a copolymerizable vinyl compound, (C) a photopolymerization initiator or a photopolymerization initiator system, and (D) a compound of the formula:

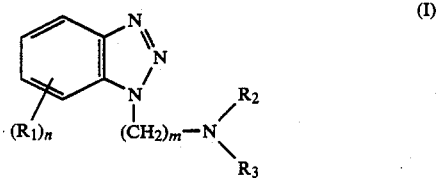

(I)

wherein n and m are independently an integer of 1 to 3; $R_1$ is a hydroxyl group, a carboxyl group, an amino group, or an alkylamino group having 1 to 20 carbon atoms; and $R_2$ and $R_3$ are independently an alkyl group having 1 to 12 carbon atoms or a hydroxyalkyl group having 1 to 12 carbon atoms.

This invention also provides a photosensitive film comprising a base film, a layer of the photosensitive resin composition mentioned above formed thereon, and optionally a protective film formed on said photosensitive layer.

DESCRIPTION OF THE PREFERRED EMBODIMENTS

The carboxyl group-containing, film forming properties-imparting polymer [component (A)] used in this invention includes, for example, copolymers of a (meth)acrylic acid (referring to methacrylic acid or acrylic acid; hereinafter the same applied) alkyl ester and (meth)acrylic acid, and copolymers of a (meth)acrylic acid alkyl ester, (meth)acrylic acid and a vinyl monomer copolymerizable with them. These copolymers can be used singly or as a mixture thereof.

The (meth)acrylic acid alkyl ester includes, for example, methyl (meth)acrylate, ethyl (meth)acrylate, butyl (meth)acrylate, 2-ethylhexyl (meth)acrylate, etc. The vinyl monomer copolymerizable with (meth)acrylic acid alkyl ester and (meth)acrylic acid includes, for example, tetrahydrofurfuryl (meth)acrylate, dimethylaminoethyl (meth)acrylate, diethylaminoethyl (meth)acrylate, glycidyl methacrylate, 2,2,2-trifluoroethyl (meth)acrylate, 2,2,3,3-tetrafluoropropyl (methyl)acrylate acrylamide, diacetone acrylamide, styrene, vinyltoluene, etc.

The copolymerizable vinyl compound [component (B)] used in this invention includes monofunctional vinyl monomers and polyfunctional vinyl monomers.

As the monofunctional vinyl monomers, there can be exemplified the vinyl monomers exemplified as comonomers in the case of the component (A). In addition to them, there can be exemplified carboxylic acid having two or more hydroxyl groups (e.g. phthalic anhydride) with a substance having a hydroxyl group and an ethylenic unsaturated group (e.g. β-hydroxyethyl (meth)acrylate); alkyl esters of acrylic acid or methacrylic acid, such as methyl (meth)acrylate, ethyl (meth)acrylate, butyl (meth)acrylate, 2-ethylhexyl (meth)acrylate, etc.; and urethane (meth)acrylates such as reaction product of tolylene diisocyanate with 2-hydroxyethyl (meth)acrylate, reaction product of trimethylhexamethylene diisocyanate with cyclohexanedimethanol and 2-hydroxyethyl (meth)acrylate, etc. Of these compounds, compounds having at least two vinyl groups in the molecule are preferably used. These compounds can be used singly or as a mixture thereof.

The photopolymerization initiator or photopolymerization initiator system [component (C)] used in this invention includes, for example, aromatic ketones such

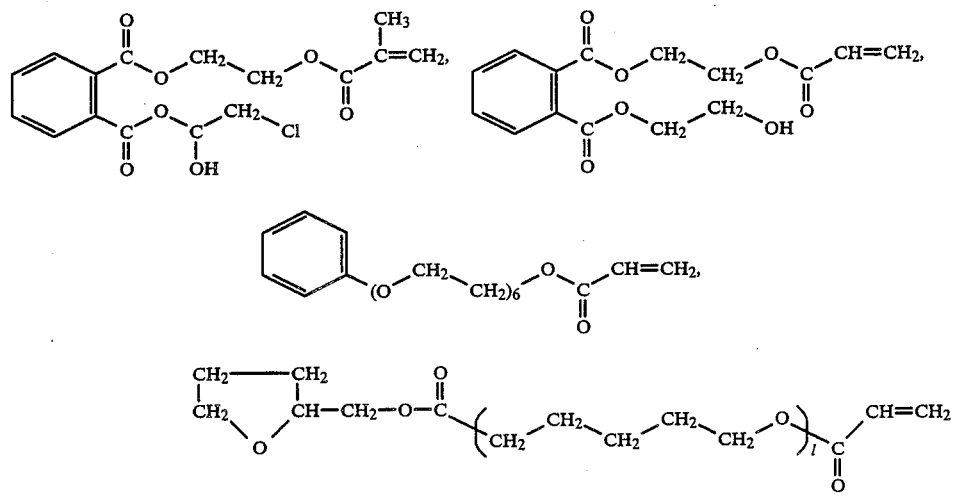

wherein l is an integer of 1 or 2,

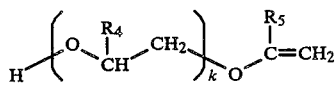

wherein $R_4$ and $R_5$ are independently a hydrogen atom or a methyl group; and k is an integer of 2 to 14.

The polyfunctional vinyl monomers include, for example, compounds obtained by reacting an α,β-unsaturated carboxylic acid with a polyhydric alcohol, such as polyethylene glycol di(meth)acrylates having 2 to 14 ethylene groups, trimethylolpropane di(meth)acrylate, trimethylolpropane tri(meth)acrylate, trimethylolpropane ethoxytri(meth)acrylate, trimethylolpropane propoxytri(meth)acrylate, tetramethylolmethane tri(meth)acrylate, tetramethylolmethane tetra(meth)acrylate, polypropylene glycol di(meth)acrylates having 2 to 14 propylene groups, dipentaerythritol penta(meth)acrylate, dipentaerythritol hexa(meth)acrylate, etc.; bisphenol A polyoxyethylene di(meth)acrylates such as bisphenol A dioxyethylene di(meth)acrylate, bisphenol A trioxyethylene di(meth)acrylate, bisphenol A decaoxyethylene di(meth)acrylate, etc.; compounds obtained by adding an α,β-unsaturated carboxylic acid to a glycidyl group-containing compound, such as trimethylolpropane triglycidyl ether triacrylate, bisphenol A diglycidyl ether diacrylate, etc.; esterified product of a as benzophenone, N,N'-tetramethyl-4,4'-diaminobenzophenone (Michler's ketone), N,N-tetraethyl-4,4'-diaminobenzophenone, 4-methoxy-4'-dimethylaminobenzophenone, 2-ethylanthraquinone, phenanthrenequinone, etc.; benzoin ethers such as benzoin methyl ether, benzoin ethyl ether, benzoin phenyl ether, etc.; benzoin compounds such as methylbenzoin, ethylbenzoin, etc.; acridine compounds such as diester compounds of β-(acrydin-9-yl)acrylic acid, 9-phenylacridine, 9-pyridylacridine, etc.; and 2,4,5-triarylimidazole dimers such as 2-(o-chlorophenyl)-4,5-diphenylimidazole dimer, 2-(o-chlorophenyl)-4,5-di(m.-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, etc. These compounds can be used singly or as a mixture thereof.

The blending amount of the component (A) is preferably 10 to 80 parts by weight, more preferably 30 to 70 parts by weight, per 100 parts by weight of the sum of the component (A) and the component (B). The weight average molecular weight of the component (A) is preferably 10,000 to 200,000 from the viewpoint of coating properties, film strength, and developability.

The blending amount of the component (B) is preferably 20 to 90 parts by weight, more preferably 30 to 70 parts by weight, per 100 parts by weight of the sum of the component (A) and the component (B). When this blending amount is too small, only brittle light-cured product can be obtained and no satisfactory physical properties can be attained. When it is too large, sufficient sensitivity cannot be attained in some cases.

The blending amount of the component (C) is preferably 0.03 to 20 parts by weight, more preferably 0.05 to 10 parts by weight, per 100 parts by weight of the sum of the component (A) and the component (B). When this blending amount is too small, sufficient sensitivity cannot be attained. When it is too large, light absorption at the surface of the composition during exposure is increased, so that light-curing in the inner part becomes insufficient in some cases.

The compound of the formula shown below [component (D)] used in this invention is explained below:

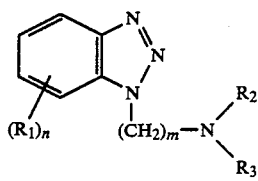

wherein n and m are independently an integer of 1 to 3; $R_1$ is a hydroxyl group, a carboxyl group, an amino group, or an alkylamino group having 1 to 20 carbon atoms; and $R_2$ and $R_3$ are independently an alkyl group having 1 to 12 carbon atoms, or a hydroxyalkyl group having 1 to 12 carbon atoms.

When n is zero in the general formula (I), the resistance to plating is only slightly improved. A compound of the general formula (I) in which $n \geq 4$ is difficulty available. When m is zero, the resistance to plating is not improved at all. A compound of the general formula (I) in which $m \geq 4$ is difficulty available.

The alkylamino group having 1 to 20 carbon atoms for $R_1$ includes, for example, methylamino group, dimethylamino group, ethylamino group, diethylamino group, methylethylamino group, propylamino group, dipropylamino group, diisopropylamino group, butylamino group, dibutylamino group, diisobutylamino group, di-t-butylamino group, dipentylamino group, dihexylamino group, dicyclohexylamino group, di(methylcyclohexyl)amino group, di(ethylcyclohexyl)amino group, dioctylamino group, di-2-ethylhexylamino group, didecylamino group, etc.

A carboxyl group is preferable as $R_1$.

The alkyl group having 1 to 12 carbon atoms for each of $R_2$ and $R_3$ includes, for example, methyl group, ethyl group, propyl group, isopropyl group, butyl group, isobutyl group, t-butyl group, pentyl group, hexyl group, cyclohexyl group, methylcyclohexyl group, ethylcyclohexyl group, heptyl group, octyl group, 2-ethylhexyl group, nonyl group, decyl group, dodecyl group, undecyl group, etc. The hydroxyalkyl group having 1 to 12 carbon atoms for each of $R_2$ and $R_3$ includes groups formed by replacement of one hydrogen atom of the above-exemplified alkyl groups by a hydroxyl group. Alkyl groups having 1 to 12 carbon atoms are preferable as $R_2$ and $R_3$.

The compound of the general formula (I) used as component (D) in this invention can be obtained, for example, by mixing 1 mole of a 1,2,3-benzotriazole derivative of the general formula (II):

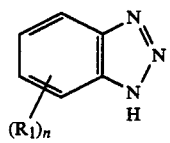

wherein $R_1$ and n have the same meanings as in the general formula (I), 1 mole of paraformaldehyde and 1 mole of an amine of the general formula (III):

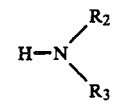

wherein $R_2$ and $R_3$ have the same meanings as in the general formula (I), carrying out the reaction (dehydrating-condensation) at 120° to 170° C. for 10 minutes to 3 hours, and filtering the reaction mixture to remove unreacted materials and by-products.

Specific examples of the compound as component (D) are bis(N,N-2-ethylhexyl)aminomethylene-5-carboxy-1,2,3-benzotriazole (e.g. F-804, a trade name, mfd. by Chiyoda Chemical Laboratories, Ltd.), bis(N,N-2-ethylhexyl)aminomethylene-4-carboxy-1,2,3-benzotriazole, bis(N,N-2-ethylhexyl)aminoethylene-5-carboxy-1,2,3-benzotriazole, bis(N,N-2-ethylhexyl)aminomethylene-5-hydroxy-1,2,3-benzotriazole, bis(N,N-2-ethylhexyl)aminomethylene-5-amino-1,2,3-benzotriazole, bis(N,N-2-ethylhexyl)aminomethylene-5-dimethylamino-1,2,3-benzotriazole, bis(N,N-isopropyl)aminomethylene-5-carboxy-1,2,3-benzotriazole, bis(N,N-2-ethylhexyl)aminomethylene- 4,5-dicarboxy-1,2,3-benzotriazole, bis(N,N-2-ethylhexyl)aminomethylene-4,5,6-tricarboxy-1,2,3-benzotriazole, etc. Of these, bis(N,N-2-ethylhexyl)aminomethylene-5-carboxy-1,2,3-benzotriazole of the formula:

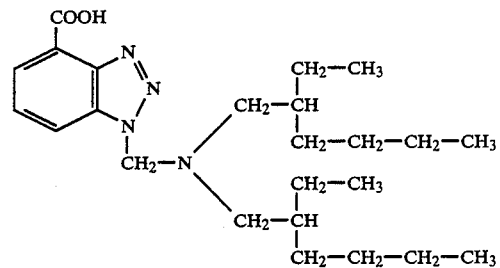

and bis(N,N-2-ethylhexyl)aminomethylene-4-carboxy-1,2,3-benzotriazole of the formula:

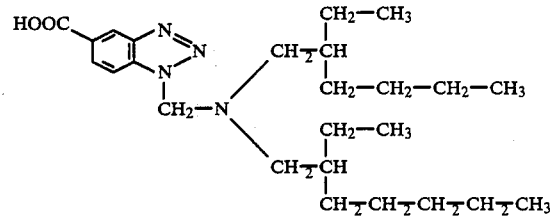

are preferable.

These compounds can be used singly or as a mixture thereof.

The blending amount of the component (D) is preferably 0.001 to 5.0 parts by weight, more preferably 0.01 to 1.0 part by weight, most preferably 0.05 to 0.5 part by weight, per 100 parts by weight of the sum of the component (A) and the component (B).

If necessary, plasticizers, thermopolymerization inhibitors, dyes, pigments, fillers, adhesive-properties-imparting agents, etc. can be included in the photosensitive resin composition of this invention.

The photosensitive resin composition of this invention is used after being coated on a surface of a metal, for example, copper, nickel or chromium, preferably on a copper surface, in the form of a liquid resist, dried, and covered with a protective film, or it is used in the form of a photosensitive film. Although the thickness of a layer of the photosensitive resin composition is varied depending on purposes, the thickness after drying is approximately 10–100 μm. When the photosensitive resin composition is coated in the form of a liquid resist, a film of an inert polyester such as polyethylene terephthalate or polypropylene terephthalate can be used as a protective film.

The photosensitive film (or laminate) can be obtained by coating the photosensitive resin composition on a base film of polyester or the like, drying the same, thereby laminating the same on the base film, and optionally laminating thereon a protective film of polyolefin or the like. The photosensitive resin composition may, if necessary, be coated in the form of a solution prepared by mixing the composition with a solvent such as acetone, methyl ethyl ketone, methylene chloride, toluene, methanol, ethanol, propanol, butanol, methyl glycol, ethyl glycol, propylene glycol monomethyl ether, etc. or a mixed solvent thereof.

The photosensitive resin composition layer thus formed is irradiated with actinic rays through a negative or positive mark pattern called "artwork", and then developed with a developing solution to give a resist pattern. As a source of the actinic rays, there is used a light source capable of emitting ultraviolet rays effectively, for example, carbon arc lamp, ultrahigh pressure mercury lamp, high pressure mercury lamp, xenon lamp, metal halide lamp, etc.

As the developing solution, there is used one which is safe, stable, and easy to handle. In the case of an alkaline developable type photoresist as in this invention, a diluted sodium carbonate solution or the like is used. A method for the development includes dipping method, buddling method, spraying method, etc. A high-pressure spraying method is most suitable for improving the resolution.

Electroplating conducted after the development includes copper deposition such as sulfuric acid plating, pyrophosphoric acid plating, etc.; solder deposition such as High-thro solder deposition, etc.; nickel deposition such as plating in Watts bath (nickel sulfate-nickel chloride), sulfamic acid plating, etc.; and gold deposition such as hard gold deposition, soft gold deposition, etc.

This invention is illustrated below in further detail with reference to Examples.

EXAMPLES 1 to 4 and COMPARATIVE EXAMPLES 1 to 6

A solution was obtained by bleeding 100 g (solids: 40 g) of a 40 wt % solution of a methacrylic acid-methyl methacrylated-butyl methacrylate-2-ethylhexyl acrylate copolymer (weight ratio 25/50/5/20, weight average molecular weight 80,000) dissolved in a mixture of methyl Cellosolve and toluene (6/4 by weight), 40 g (solids: 20 g) of a 50 wt % solution of methacrylic acid-methyl methacrylate-ethyl acrylate-styrene copolymer (weight ratio 30/30/30/10, weight average molecular weight 40,000) dissolved in a mixture of methyl Cellosolve and toluene (8:2 by weight), 0.17 g of bis-4-(N,N-diethylamino)benzophenone, 4 g of benzophenone, 1.0 g of tribromomethylphenyl sulfone, 1 g of leucocrystal violet, 0.05 g of malachite green, 3.0 g of DMBI (isopentyl 4-dimethylaminobenzoate, a trade name, mfd. by Nippon Kayaku Co., Ltd.), 10 g of methyl ethyl ketone, 10 g of toluene, 3 g of methanol and 40 g of NK-4G (tetraethylene glycol dimethacrylate, a trade name, mfd. by Shin-Nakamura Chemical Co., Ltd.).

In the thus obtained solution was dissolved 0.05 to 0.2 g of each compound listed in Table 1, whereby solutions of photosensitive resin composition were obtained.

Subsequently, each solution of photosensitive resin composition was uniformly coated on a polyethylene terephthalate film of 25 μm in thickness and dried in a hot-air convection drier at 100° C. for about 10 minutes to obtain a photosensitive film. The thickness of layer of the photosensitive resin composition after the drying was 50 μm.

On the other hand, the copper surface of a copper-clad laminate (MCL-E-61, mfd. by Hitachi Chemical Company, Ltd.) which was a glass-epoxy material having copper foil (thickness: 35 μm) laminated on each side, was polished by means of a polishing machine (mfd. by Sankei Co., Ltd.) having a brush corresponding to #800, washed with water, and dried in an air stream. The copper-clad laminate thus treated was heated at 80° C., and the photosensitive resin composition layer formed in the above was laminated on the copper surface of the heated laminate while heating the composition layer at 120° C.

Then, the substrate thus obtained was exposed to light from a 3 KW high pressure mercury lamp (HMW-201B, mfd. by Orc Manufacturing Co., Ltd.) at a dose of 60 mJ/cm$^2$ through a negative. In this case, for evaluating the photosensitivity, the negative used is a negative produced so as to be in light transmittance stepwise (a step tablet in which the optical density increased by 0.15 every step from 0.05 at the first step).

Next, the polyethylene terephthalate film was removed, and the unexposed portion was removed by spraying a 1% aqueous sodium carbonate solution at 30° C. for 50 to 150 seconds. Then, the photosensitivity of the photosensitive resin composition was evaluated by counting the steps of step tablet of the light-cured film formed on the copper-clad laminate. The results obtained are shown in Table 1. The photosensitivity is expressed in terms of the number of steps of this step tablet: the larger the number of steps of this step tablet, the higher the photosensitivity.

Subsequently, the substrate subjected to the development was defatted, washed with running water for 1 minute, and then immersed in an aqueous solution containing 10 vol % of hydrogen peroxide and 20 vol % of sulfuric acid for 2 minutes. Thereafter, the substrate was washed with running water for 1 minute, immersed in a 10% aqueous sulfuric acid solution for 1 minute, and then washed with running water for 1 minute. The substrate was then placed in a copper deposition bath [copper sulfate 75 g/liter, sulfuric acid 190 g/liter, chlorine ion 75 ppm, Copper Gream PCM (a trade name, mfd. by Japan Meltex Inc.) 5 ml/liter], and copper plating was conducted under conditions of 25° C. and 3 A/dm² for 40 minutes. Immediately after completion of the copper plating, the substrate was washed with water, immersed in a 10% aqueous borofluoric acid solution for 1 minute, and then placed in a solder deposition bath [45% tin tetrafluoroborate 64 ml/liter, 45% lead tetrafluoroborate 22 ml/liter, 42% fluoroboric acid 200 ml/liter, Pultin LA conductivity salt (a trade name, mfd. by Japan Meltex Inc.), and Pultin LA starter (a trade name, mfd. by Japan Meltex Inc.)], and solder plating was conducted under conditions of 25° C. and 2 A/dm² for 20 minutes. After completion of the solder plating, the substrate was washed with water and dried.

For evaluating the resistance to plating, a cellophane adhesive tape was attached to the substrate and perpendicularly peeled off, after which whether the resist had been peeled off or not was investigated (tape test). Then, the existence of underplating of a solder plating layer was investigated from above by an optical microscope. In the case where underplating of a solder plating layer had been caused, the solder plating layer was observed under a transparent resist therethrough. The results obtained are shown in Table 1.

On the other hand, the same substrate after the development as described above was placed in a 5% cupric chloride solution and allowed to stand for 1 minute. In the case where sufficient etching was achieved, the copper surface turned black immediately. In the case where any organic substance existed on the copper surface, there was a non-etched portion which remained brown. Immediately after the standing, the substrate was washed with water, the existence of a non-etched portion was investigated by visual observation ($CuCl_2$ test).

Separately, the same photosensitive film as described above was laminated on the same substrate as described above, and the resulting assembly was allowed to stand under conditions of 30° C. and 90% RH for 24 hours and then tested in the same manner as described above. The evaluation results obtained are shown in Table 1.

TABLE 1

| | | | Lamination-Exposure 23° C., 1h | | | |
|---|---|---|---|---|---|---|
| | Compound (D) | Blending amount of compound (D) | Sensitivity | Tape test | Existance of underplating | $CuCl_2$ test *4 |
| Example 1 | Bis(N,N-2-ethylhexyl)-aminomethylene-5-carboxy-1,2,3-benzotriazole *1 | 0.01 | 8.0 | Not peeled | None | O |
| Example 2 | Bis(N,N-2-ethylhexyl)-aminomethylene-5-carboxy-1,2,3-benzotriazole *1 | 0.05 | 7.9 | " | " | O |
| Example 3 | Bis(N,N-2-ethylhexyl)-aminomethylene-5-carboxy-1,2,3-benzotriazole *1 | 0.1 | 8.0 | " | " | O |
| Example 4 | Bis(N,N-2-ethylhexyl)-aminomethylene-5-carboxy-1,2,3-benzotriazole *1 | 0.2 | 8.0 | " | " | O |
| Comparative Example 1 | None | — | 8.1 | Peeled | Caused | O |
| Comparative Example 2 | 1,2,3-Benzotriazole | 0.1 | 8.0 | Not peeled | None | X |
| Comparative Example 3 | Bis(N,N-2-ethylhexyl)-aminomethylene-1,2,3-benzotriazole *2 | 0.1 | 7.9 | Peeled | Caused | O |
| Comparative Example 4 | 5-Carboxy-1,2,3-benzotriazole | 0.1 | 8.0 | Not peeled | None | X |
| Comparative Example 5 *3 | None | — | 6.0 | Peeled | Caused | O |
| Comparative Example 6 *3 | 5-Carboxy-1,2,3-benzotriazole | 0.1 | 6.0 | Not peeled | None | X |

| | | Lamination-Exposure 30° C., 90% RH, 24h | | | |
|---|---|---|---|---|---|
| | Compound (D) | Sensitivity | Tape test | Existence of underplating | $CuCl_2$ test *4 |
| Example 1 | Bis(N,N-2-ethylhexyl)-aminomethylene-5-carboxy-1,2,3-benzotriazole *1 | 8.0 | Not peeled | None | O |
| Example 2 | Bis(N,N-2-ethylhexyl)-aminomethylene-5-carboxy-1,2,3-benzotriazole *1 | 7.9 | " | " | O |
| Example 3 | Bis(N,N-2-ethylhexyl)-aminomethylene-5-carboxy-1,2,3-benzotriazole *1 | 8.0 | " | " | O |
| Example 4 | Bis(N,N-2-ethylhexyl)-aminomethylene-5-carboxy-1,2,3-benzotriazole *1 | 7.9 | " | " | O |
| Comparative Example 1 | None | 7.0 | Peeled | Caused | O |
| Comparative Example 2 | 1,2,3-Benzotriazole | 6.9 | Not peeled | None | X |
| Comparative Example 3 | Bis(N,N-2-ethylhexyl)-aminomethylene-1,2,3-benzotriazole *2 | 7.5 | Peeled | Caused | O |
| Comparative Example 4 | 5-Carboxy-1,2,3-benzotriazole | 7.0 | Not peeled | None | X |

TABLE 1-continued

| | | | | | |
|---|---|---|---|---|---|
| Comparative Example 5 *3 | None | 6.0 | Peeled | Caused | O |
| Comparative Example 6 *3 | 5-Carboxy-1,2,3-benzotriazole | 6.0 | Not peeled | None | X |

*1 F-804, a trade name, mfd. by Chiyoda Chemical Laboratories, Ltd.
*2 BT-LX, a trade name, mfd. by Johoku Chemical Co., Ltd.
*3 The photosensitive resin compositions of Comparative Examples 5 and 6 contained 0.1 part of hydroquinone monomethyl ether
*4 O: no non-etched portion, X: a non-etched portion existed.

As can be seen from Table 1, in Comparative Example 2 in which 1,2,3-benzotriazole was used, and Comparative Examples 4 and 6 in which 5-carboxy-1,2,3-benzotriazole was used, the result of the $CuCl_2$ test was not satisfactory, and the standing for 24 hours after the lamination lowered the sensitivity. In Comparative Example 1 in which the compound (D) was not added at all, and Comparative Example 3 in which an 1,2,3-benzotriazole derivative was used, the results of the tape test and the investigation of underplating were not satisfactory.

In Comparative Examples 5 and 6 in which hydroquinone monomethyl ether was added, the standing for 24 hours after the lamination did not change the sensitivity, but the sensitivity itself was lowered immediately after the lamination.

On the other hand, in Examples 1 to 4 which were within the scope of the invention, the sensitivity was high and the stability after lamination, the adhesive properties, the etchability of base metal, the resistance to plating, etc. were very excellent.

The photosensitive resin composition and the photosensitive film using the same of this invention are highly sensitive to copper-clad laminates used in metal laminates, in particular, printed circuit boards, and are very excellent in stability, adhesive properties, etchability of base metal, resistance to plating, etc.

What is claimed is:

1. A photosensitive resin composition comprising
  (A) a carboxyl group-containing, film forming properties-imparting polymer,
  (B) a copolymerizable vinyl compound,
  (C) a photopolymerization initiator or a photopolymerization initiator system, and
  (D) a compound of the formula:

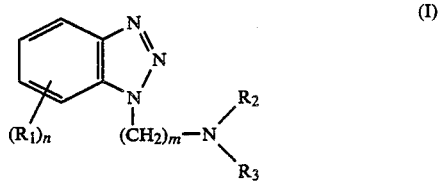

(I)

wherein n and m are independently an integer of 1 to 3; $R_1$ is a hydroxyl group, a carboxyl group, an amino group, or an alkylamino group having 1 to 20 carbon atoms; and $R_2$ and $R_3$ are independently an alkyl group having 1 to 12 carbon atoms or a hydroxyalkyl group having 1 to 12 carbon atoms.

2. A photosensitive resin composition according to claim 1, wherein the compound (D) is a compound of the general formula (I) in which $R_1$ is a carboxyl group.

3. A photosensitive resin composition according to claim 1, wherein the compound (D) is bis(N,N-2-ethylhexyl)aminomethylene-5-carboxy-1,2,3-benzotriazole, or bis(N,N-2-ethylhexyl)aminomethylene-4-carboxy-1,2,3-benzotriazole.

4. A photosensitive resin composition according to claim 1, wherein the copolymerizable vinyl compound of (B) is a compound having at least two vinyl groups in the molecule.

5. A photosensitive resin composition according to claim 1, wherein the amounts of the components (A), (B) and (D) are 10 to 80 parts by weight, 20 to 90 parts by weight, and 0.001 to 5.0 parts by weight, respectively, per 100 parts by weight of the sum of the component (A) and the component (B).

6. A photosensitive film comprising a base film, a layer of the photosensitive resin composition of claim 1 formed thereon, and optionally a protective film formed on said photosensitive layer.

* * * * *